US012587183B2

(12) United States Patent
Yang

(10) Patent No.: US 12,587,183 B2
(45) Date of Patent: Mar. 24, 2026

(54) SOLID-STATE AIDED AIRGAP FOR DC CIRCUIT BREAKERS

(71) Applicant: Siemens Industry, Inc., Alpharetta, GA (US)

(72) Inventor: Guang Yang, Johns Creek, GA (US)

(73) Assignee: Siemens Industry, Inc., Alpharetta, GA (US)

( * ) Notice: Subject to any disclaimer, the term of this patent is extended or adjusted under 35 U.S.C. 154(b) by 157 days.

(21) Appl. No.: 18/617,734

(22) Filed: Mar. 27, 2024

(65) Prior Publication Data

US 2025/0309880 A1 Oct. 2, 2025

(51) Int. Cl.
*H02H 9/00* (2006.01)
*H03K 17/08* (2006.01)

(52) U.S. Cl.
CPC .................................... *H03K 17/08* (2013.01)

(58) Field of Classification Search
None
See application file for complete search history.

(56) References Cited

U.S. PATENT DOCUMENTS

| | | | |
|---|---|---|---|
| 11,398,724 B1 * | 7/2022 | Yang | .................... H02H 1/0007 |
| 11,798,756 B2 | 10/2023 | Yang | |
| 2023/0230783 A1 | 7/2023 | Yang | |

FOREIGN PATENT DOCUMENTS

GB        2610864 A        3/2023

* cited by examiner

*Primary Examiner* — Stephen W Jackson

(57) ABSTRACT

A DC solid-state circuit breaker includes a power electronics section, an airgap section, and a sensing and control circuit. The power electronics section includes a first solid-state switching component. The airgap section is connected in series with the power electronics section to establish a main current path. The airgap section implements an isolation switch connected in series with a fail-safe interruption circuit that includes a current commutation switch, a second solid-state switching component, and an overvoltage protection device connected in parallel with one another. In response to detecting a fault event and/or an opening command, the sensing and control circuit performs a fail-safe operation that controls the isolation switch at a time period, and controls the current commutation switch and the second solid-state switching component at a delayed time period that occurs after controlling the isolation switch.

18 Claims, 6 Drawing Sheets

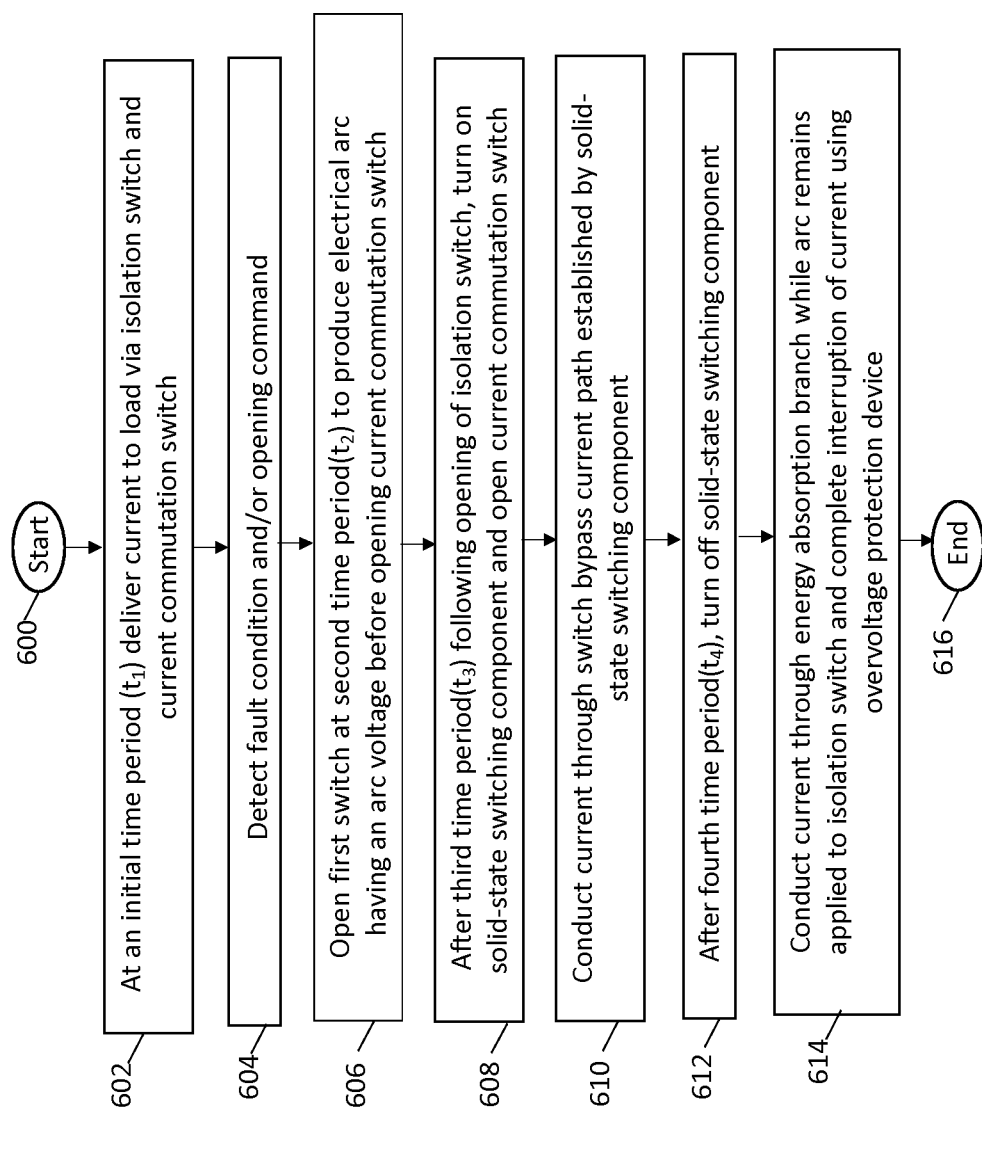

600 — Start

602 — At an initial time period ($t_1$) deliver current to load via isolation switch and current commutation switch 604 — Detect fault condition and/or opening command 606 — Open first switch at second time period($t_2$) to produce electrical arc having an arc voltage before opening current commutation switch 608 — After third time period($t_3$) following opening of isolation switch, turn on solid-state switching component and open current commutation switch 610 — Conduct current through switch bypass current path established by solid-state switching component 612 — After fourth time period($t_4$), turn off solid-state switching component 614 — Conduct current through energy absorption branch while arc remains applied to isolation switch and complete interruption of current using overvoltage protection device 616 — End

FIG. 6

SOLID-STATE AIDED AIRGAP FOR DC CIRCUIT BREAKERS

BACKGROUND

1. Field

The present disclosure relates generally to direct current (DC) solid-state circuit breakers, and more particularly, to a DC solid-state circuit breaker having low-voltage rated power electronics configured to establish a solid-state aided airgap.

2. Description of the Related Art

In today's electricity distribution, alternating current (AC) power is utilized in a wide variety of electrical systems. However, many electronic devices and end systems, such as an electric vehicle, home appliances and data centers use direct current (DC) power. Therefore, conversion between AC and DC is inevitable and energy waste happens at the conversion point. A direct DC to DC supply is much more efficient. A fundamental issue of DC supply systems is that existing protection devices, such as circuit breakers, are mainly designed for AC systems and are not suitable for similar voltage DC systems. For example, a 120 volt (V) AC rated circuit breaker cannot be used in a 125V DC system, and can only be used with lower DC voltage, such as 48V. This is mainly due to the contacts used in today's thermal-magnetic circuit breakers create arcs, which cannot be effectively extinguished without the natural zero crossing in AC systems. For efficiency purposes, today's systems increasingly need higher DC voltages, such as 380V and 500V, which require expensive and bulky mechanical designs, but still can suffer from reliability issues due to the inherent issue of lack of zero crossing. Therefore, a smaller, more cost effective, and more reliable DC circuit breaker design is needed.

Solid-state circuit breakers use power electronics as switching components instead of contacts as in traditional thermal-magnetic circuit breakers, and the switching process is arc free. Therefore, solid-state circuit breakers show promising aspects for use in both AC and DC systems. However, solid-state circuit breakers normally have an airgap in series of power electronic components for isolation purposes. For solid-state circuit breakers designed for AC systems, airgaps can be used as fail-safe mechanisms when power electronics fail in shorted conditions. In such situation, the arc can simply interrupt AC powers with the help of natural zero crossing. In DC systems, as discussed above, airgaps may no longer serve as a reliable fail-safe mechanism because the possibility of its own failure on interruption. Therefore, there is a need for an improved system architecture for a DC solid-state circuit breaker.

SUMMARY

A direct current (DC) solid-state circuit breaker includes a power electronics section, an airgap section, and a sensing and control circuit. The power electronics section includes a first solid-state switching component. The airgap section is connected in series with the power electronics section to establish a main current path. The airgap section implements an isolation switch connected in series with a fail-safe interruption circuit that includes a current commutation switch, a second solid-state switching component, and an overvoltage protection device connected in parallel with one another. In response to detecting a fault event and/or an opening command, the sensing and control circuit performs a fail-safe operation that controls the isolation switch at a time period, and controls the current commutation switch and the second solid-state switching component at a delayed time period that occurs after controlling the isolation switch.

According to another non-limiting embodiment, a method of interrupting current delivered to a load connected to a DC solid-state circuit breaker is provided. The method comprises delivering current to a load connected to DC solid-state circuit breaker which includes a power electronics section and an airgap section connected in series with an airgap section. The airgap section includes a fail-safe interruption circuit that comprises a current commutation switch, a second solid-state switching component, and an overvoltage protection device connected in parallel with one another. The method further includes detecting an electrical fault in the DC solid-state circuit breaker and/or an opening command. The method further includes performing a fail-safe operation that controls the isolation switch at a time period, and controls the current commutation switch and the second solid-state switching component at a delayed time period that occurs after controlling the isolation switch.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects.

FIG. 6 is a flow diagram illustrating a method of interrupting current delivered to a load connected to a DC solid-state circuit breaker.

DETAILED DESCRIPTION

Figure 1:
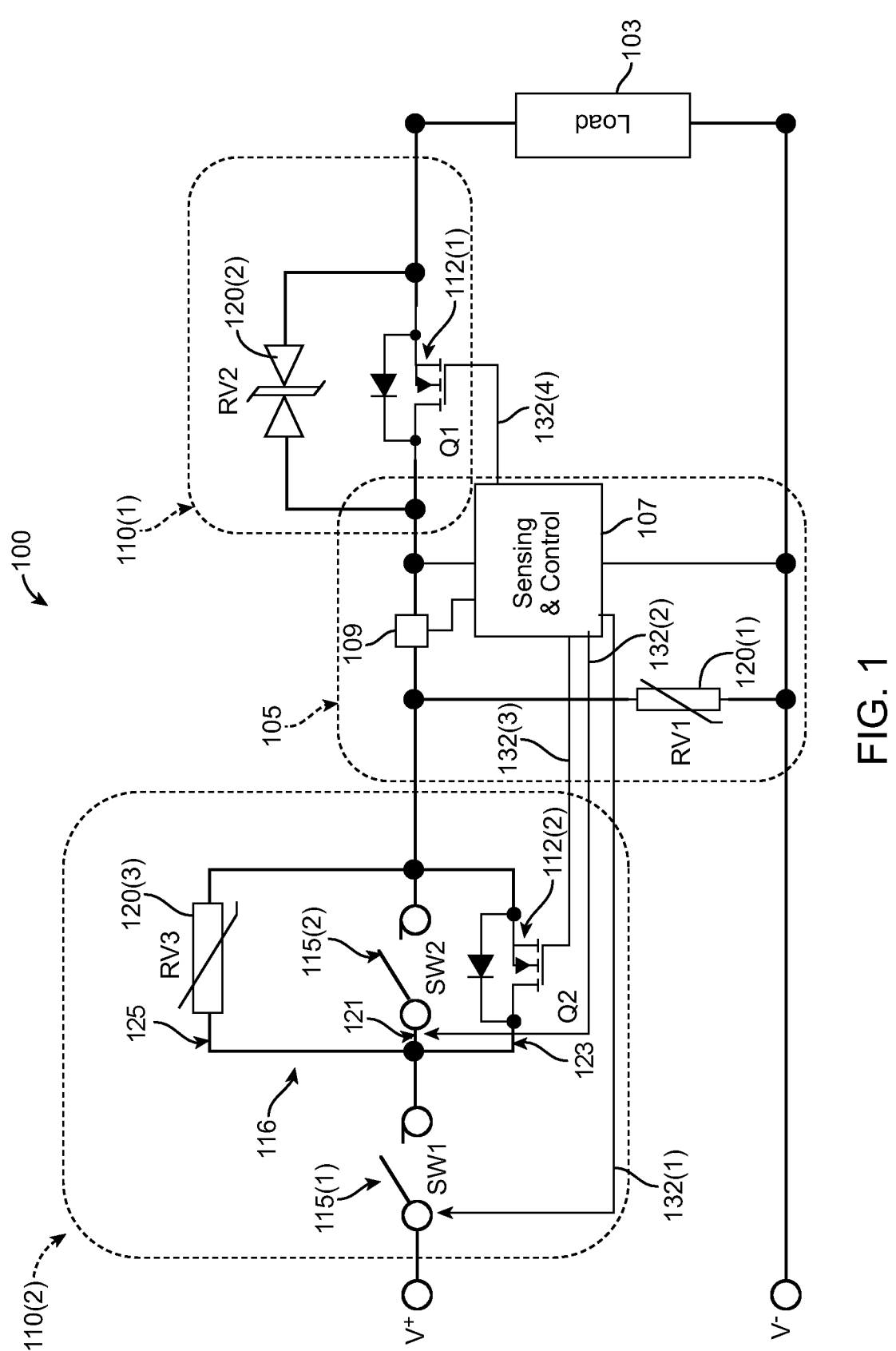
FIG. 1 illustrates a DC solid-state circuit breaker in accordance with an exemplary embodiment of the present invention.

Various technologies that pertain to systems and methods that facilitate a DC circuit breaker capable of implement low-voltage rated power electronics to establish a solid-state aided airgap that provides a fail-safe mechanism will now be described with reference to the drawings, where like reference numerals represent like elements throughout. The drawings discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged apparatus. It is to be understood that functionality that is described as being carried out by certain system elements may be performed by multiple elements. Similarly, for instance, an element may be configured to perform functionality that is described as being carried out by multiple elements. The numerous innovative teachings of the present application will be described with reference to exemplary non-limiting embodiments.

To facilitate an understanding of embodiments, principles, and features of the present disclosure, they are explained hereinafter with reference to implementation in illustrative embodiments. In particular, they are described in the context of a DC circuit breaker capable of implement low-voltage rated power electronics to establish a solid-state aided airgap. Embodiments of the present disclosure, however, are not limited to use in the described devices or methods.

The components and materials described hereinafter as making up the various embodiments are intended to be illustrative and not restrictive. Many suitable components and materials that would perform the same or a similar function as the materials described herein are intended to be embraced within the scope of embodiments of the present disclosure.

These and other embodiments of a DC circuit breaker capable of implement low-voltage rated power electronics to establish a solid-state aided airgap according to the present disclosure are described below with reference to FIGS. 1-6 herein. Like reference numerals used in the drawings identify similar or identical elements throughout the several views. The drawings are not necessarily drawn to scale.

With reference now to FIG. 1, a DC solid-state circuit breaker 100 is illustrated in accordance with a non-limiting embodiment of the present disclosure. The DC solid-state circuit breaker 100 includes a power electronics section 110(1), an airgap section 110(2), and a sensing and control circuit 105. The DC solid-state circuit breaker 100 establishes a main current path in which the power electronics section 110(1) and the airgap section 110(2) are connected in series with each other. The power electronics section 110(1) is utilized for normal-use interruption of the load current ($I_{LOAD}$), and the airgap section 110(2) is utilized for fail-safe interruption and isolation. The sensing and control circuit 105 is configured to control the operation of the power electronics section 110(1) and the airgap section 110(2). According to a non-limiting embodiment, a overvoltage protection component RV1 120(1) can be utilized to protect the sensing and control circuit 105. As described herein, the DC solid-state circuit breaker 100 described herein operates according to switching sequences that reduce the voltage level applied to the components included in the airgap section when a fault event occurs and/or when an opening command is received. The fault event includes, for example, an electronics failure such as a failure of the first solid-state switching component 112(1). The opening command can include, for example, a manual adjustment (e.g., opening) of the current commutation switch SW2 115(2) and/or a remote controlled operation to adjust (e.g., open) the current commutation switch SW2 115(2). In this manner, the voltage requirements, material costs and/or physical dimensions for the components included in the airgap section 110(2) can be reduced compared to known DC solid-state circuit breakers.

The power electronics section 110(1) includes a first solid-state switching component Q1 112(1) (e.g., a power electronics solid-state switching component) and a overvoltage protection device 120(2). The first solid-state switching component Q1 112(1) is configured to control current delivery to a load 103 connected across the positive power rail (V+) and negative power rail (V−) of the DC solid-state circuit breaker 100. According to a non-limiting embodiment, the first solid-state switching component Q1 112(1) can be implemented as a semiconductor-based device including, but not limited to, a metal-oxide-semiconductor field-effect transistors (MOSFET) and a thyristor. The first overvoltage protection device RV1 120(1) is connected in parallel with the first solid-state switching component Q1 112(1) to protect the first solid-state switching component Q1 112(1) during an overvoltage after interruptions. According to a non-limiting embodiment, the first overvoltage protection device RV1 120(1) can be implemented as a Metal Oxide Varistor (MOV), a transient-voltage-suppression (TVS) diode, and a snubber circuit etc.

The airgap section 110(2) is disposed in series with the power electronics section 110(1), and is configured to perform fail-safe interruption and to provide isolation. The airgap section 110(2) includes an isolation switch SW1 115(1) (e.g., a first switch) and a fail-safe interruption circuit 116 connected in series with the isolation switch SW1 115(1). The fail-safe interruption circuit 116 includes a parallel connection of a conducting branch 121, a bypass power electronics branch 123, and an energy absorption branch 125. The conducting branch includes a current commutation switch SW2 115(2) (e.g., a second switch). The bypass power electronics branch 123 includes a second solid-state switching component Q2 112(2). The energy absorption branch 125 includes an overvoltage protection device RV3 120(3). Accordingly, the current commutation switch SW2 115(2) and the second solid-state switching component Q2 112(2) are connected in parallel with each other.

The isolation switch SW 1 115(1) is connected in series to a fail-safe interruption combination of the current commutation switch SW2 115(2) and the second solid-state switching component Q2 112(2). According to a non-limiting embodiment, the isolation switch SW1 115(1) and the current commutation switch SW2 115(2) are configured in such a way that the isolation switch SW1 115(1) always opens before the current commutation switch SW2 115(2).

The second solid-state switching component Q2 112(2) can be implemented using a semiconductor-based device including, but not limited to, a metal-oxide-semiconductor field-effect transistor (MOSFET) and a thyristor. The overvoltage protection device 120(3) serves to protect the second solid-state switching component Q2 112(2) and the overvoltage protection device 120(3) complete current interruption when opening the current commutation switch SW2 115(2) during a fault event and/or in response to receiving an opening command. As described herein, the fault event includes, for example, an electronics failure such as a failure of the first solid-state switching component 112(1). The opening command can include, for example, a manual adjustment (e.g., opening) of the current commutation switch SW2 115(2) and/or a remote controlled operation to adjust (e.g., open) the current commutation switch SW2 115(2).

The sensing and control circuit 105 includes a controller 107 and a sensor 109. The sensor 109 is configured to measure the voltage across the positive and negative power rails (V+., V−) and/or the load current ($I_{LOAD}$) flowing through the positive power rail (V+). The controller 107 is in signal communication with the sensor 109, the 115(1), the 115(2), the 112(2), and the 112(1). The controller 107 is programmed with logic capable of detecting a fault event (e.g., overcurrent event, overload event, short-circuit, etc.) based on the measurement signal output from the sensor 109 to receive the measured voltage and/or load current. The controller 107 is also capable of responding to an opening command (e.g., manual opening and/or remote opening of the commutation switch SW2 115(2)).

The controller 107 is further configured to output one or more control signals 132(1), 132(2), 132(3) and 132(4). A first control signal 132(1) serves to control the opening and closing of the isolation switch SW1 115(1). A second control signal 132(2) serves to control the opening and closing of the current commutation switch SW2 115(2). A third control signal 132(3) serves to switch on and switch off the second solid-state switching component Q2 112(2). A fourth control signal 132(4) serves to switch on and switch off the first solid-state switching component Q1 112(1). The first and second control signals 132(1) and 132(2) can control the switches 115(1) and 115(2) using, for example, actuators, solenoids, and electromagnets. The third and fourth control signals 132(3) and 132(4) can switch on and off the first and second solid-state switching components 112(1) and 112(2) by, for example, applying or disconnecting a gate voltage. Although four control signals 132(1), 132(2), 132(3) and 132(4) are described, it should be appreciated that more or less control signals can be implemented without departing from the scope of the present disclosure.

According to a non-limiting embodiment of the present disclosure, the DC solid-state circuit breaker 100 performs a fail-safe operation which includes a plurality of switching sequences that delay complete interruption of the load current and reduce the voltage level applied to the components included in the airgap section when a fault event occurs and/or when an opening command is received (e.g., a manual opening of the current commutation switch SW2 115(2) and/or a remote controlled operation to open the current commutation switch SW2 115(2). For example, under conditions causing a fault event and where the first solid-state switching component Q1 112(1) is not able to interrupt, the isolation switch SW1 115(1) opens to begin interrupting the flow of the load current ($I_{LOAD}$). The opening of the isolation switch SW1 115(1), however, produces an arc 111 (see FIG. 3) having an arc voltage that is applied to the isolation switch and allows for the load current to flow through the positive rail (V+). Thereafter, the current commutation switch SW2 115(2) can be opened and the second solid-state switching component Q2 112(2) switched on to establish a switch bypass current path which conducts the load current through the second solid-state switching component Q2 112(2) and to the power electronics section 110(1). Once the current commutation switch SW2 115(2) are open wide enough to handle high voltages, the second solid-state switching component Q2 112(2) is turned off and the load current ($I_{LOAD}$) is conducted to the overvoltage protection device 120(3) to complete the load current interruption.

Figure 2:
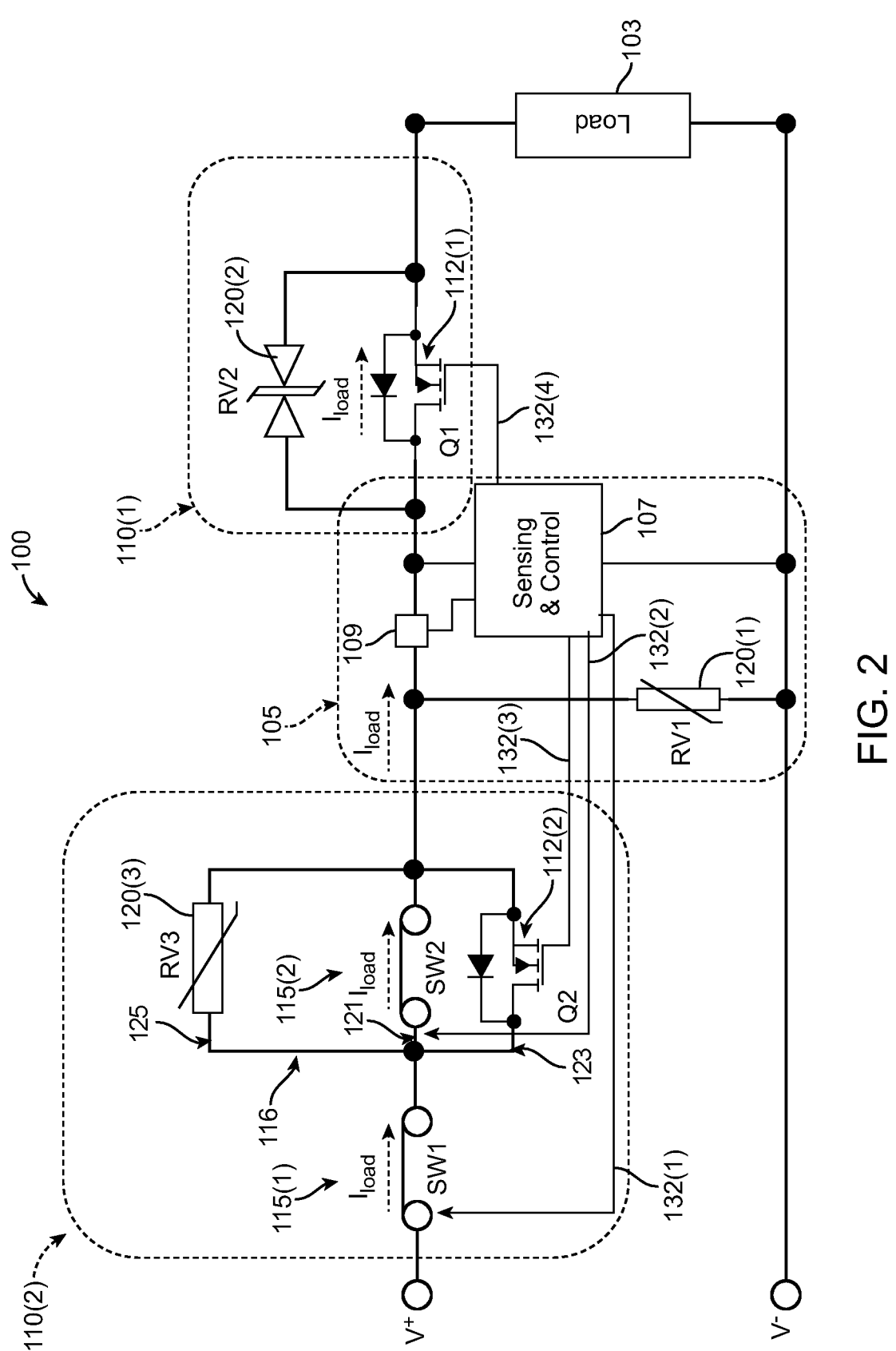
FIG. 2 illustrates the DC solid-state circuit breaker while operating in a normal operating state.

FIGS. 2-5 depict the operating sequences of the DC solid-state circuit breaker 100 according to a non-limiting embodiment of the present disclosure. Referring to FIG. 2, the DC solid-state circuit breaker 100 is shown operating in a normal operating state. At an initial time period ($t_1$), a load current ($I_{LOAD}$) is delivered to the load 103 via a main current path establish by the closed isolation switch SW1 115(1), the closed current commutation switch SW2 115(2), the switched-off second solid-state switching component Q2 112(2), and the switched-on first solid-state switching component Q1 112(1). In one or more non-limiting embodiments, the second solid-state switching component Q2 112(2) can be either switched on or switched off while load current ($I_{LOAD}$) is delivered to the load 103 via a main current path during the normal operating state because the current commutation switch SW2 115(2) establishes a short-circuit path with the second solid-state switching component Q2 112(2).

Figure 3:
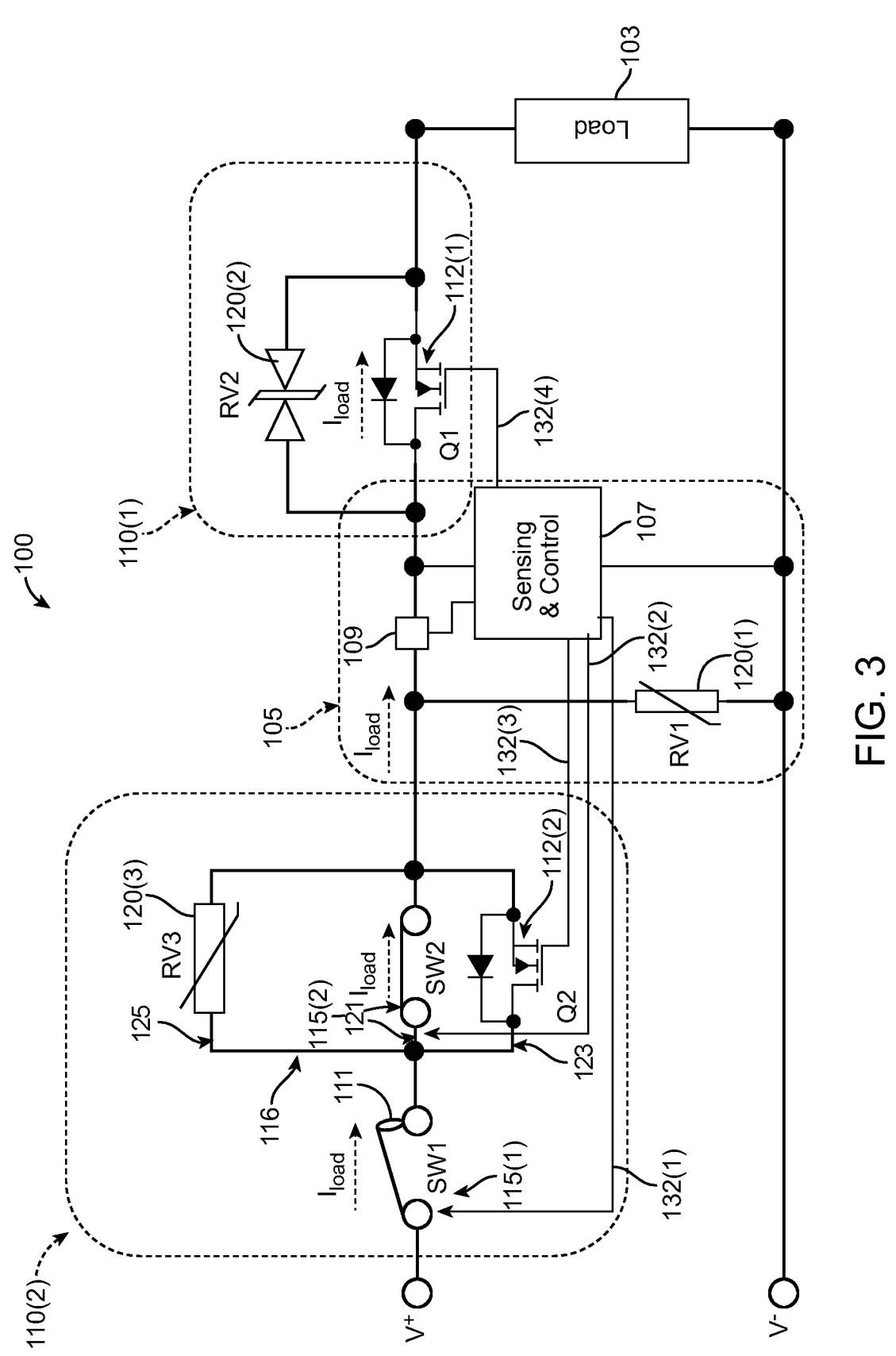
FIG. 3 illustrates the DC solid-state circuit breaker while opening a first switch to interrupt a first airgap and draw ac in response to the occurrence of a fault event and/or receiving an opening command.

Turning to FIG. 3, the airgap section 110(2) is shown invoking a fail-safe operation that includes a first switching sequence to begin interrupting the load current ($I_{LOAD}$) delivered to the load 103. As described herein, the fail-safe operation can be invoked in response to the controller 107 detecting a fault event (e.g., overcurrent event, overload event, short-circuit, etc.) and/or in response to receiving an opening command (e.g., a manual adjustment of the current commutation switch SW2 115(2) and/or a remote controlled operation to open the current commutation switch SW2 115(2)). Accordingly, the controller 107 outputs the first control signal 132(1) at a second time period (t2), which opens the isolation switch SW1 115(1). In response to opening the isolation switch SW1 115(1), an arc 111 is produced across the corresponding airgap.

Figure 4:
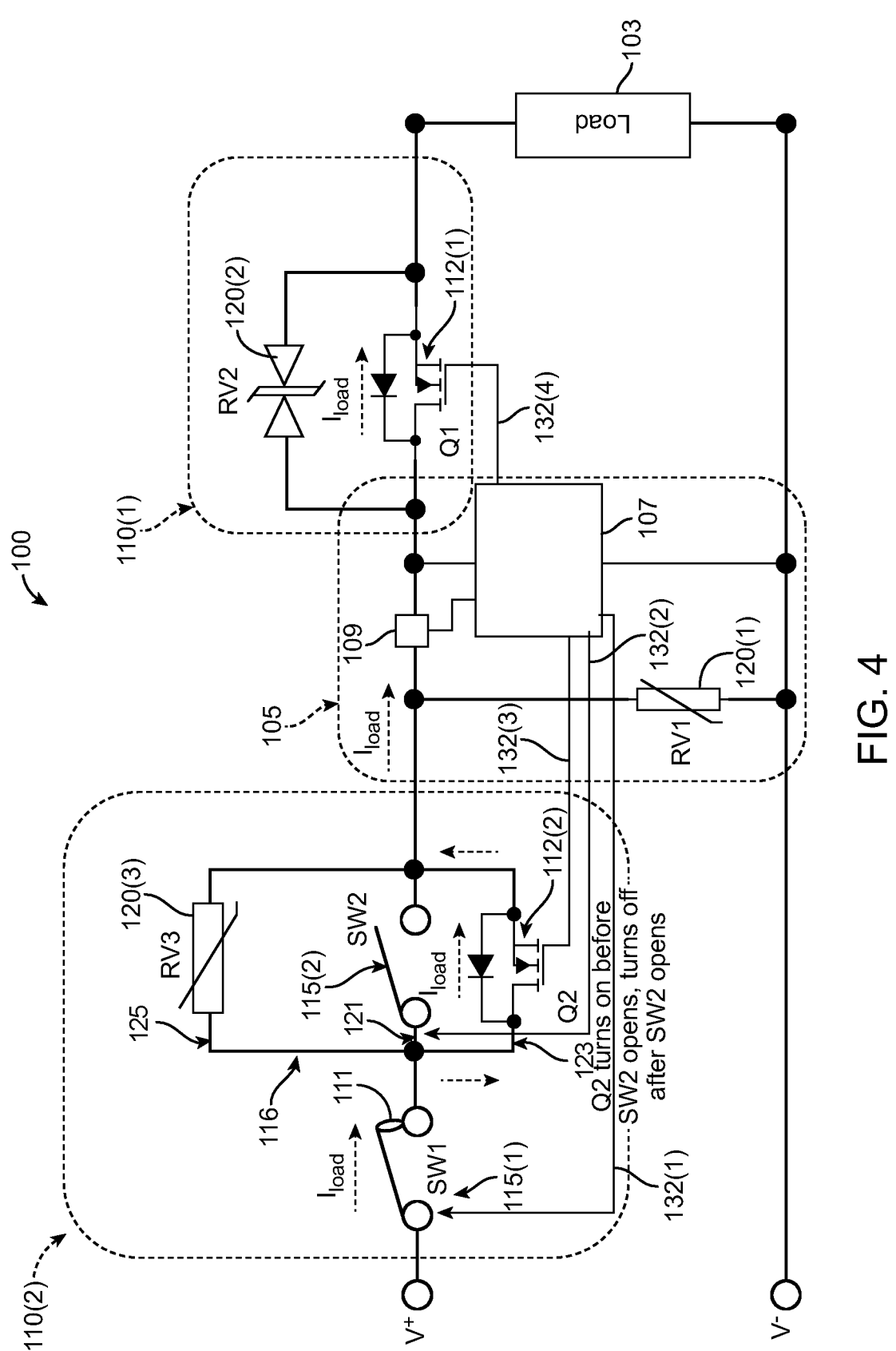
FIG. 4 illustrates the DC solid-state circuit breaker after switching on a solid-state switching component before opening a second switch to establish a first switch by-pass current path.

In FIG. 4, the controller 107 waits a third time period (t3) before outputting the second control signal 132(2) to invoke a second switching sequence. The second switching sequence includes opening the current commutation switch SW2 115(2) and the third control signal 132(3) to switch on the second solid-state switching component Q2 112(2). The third time period (t3) effectively establishes a time delay which delays switching-on the second solid-state switching component and opening the isolation switch (e.g., a first switch). According to one or more non-limiting embodiments, the time period t3 can range, for example, from 3 milliseconds (ms) to 5 ms. Accordingly, a switch bypass current path is established to conduct load current ($I_{LOAD}$) caused by the arc 111.

Figure 5:
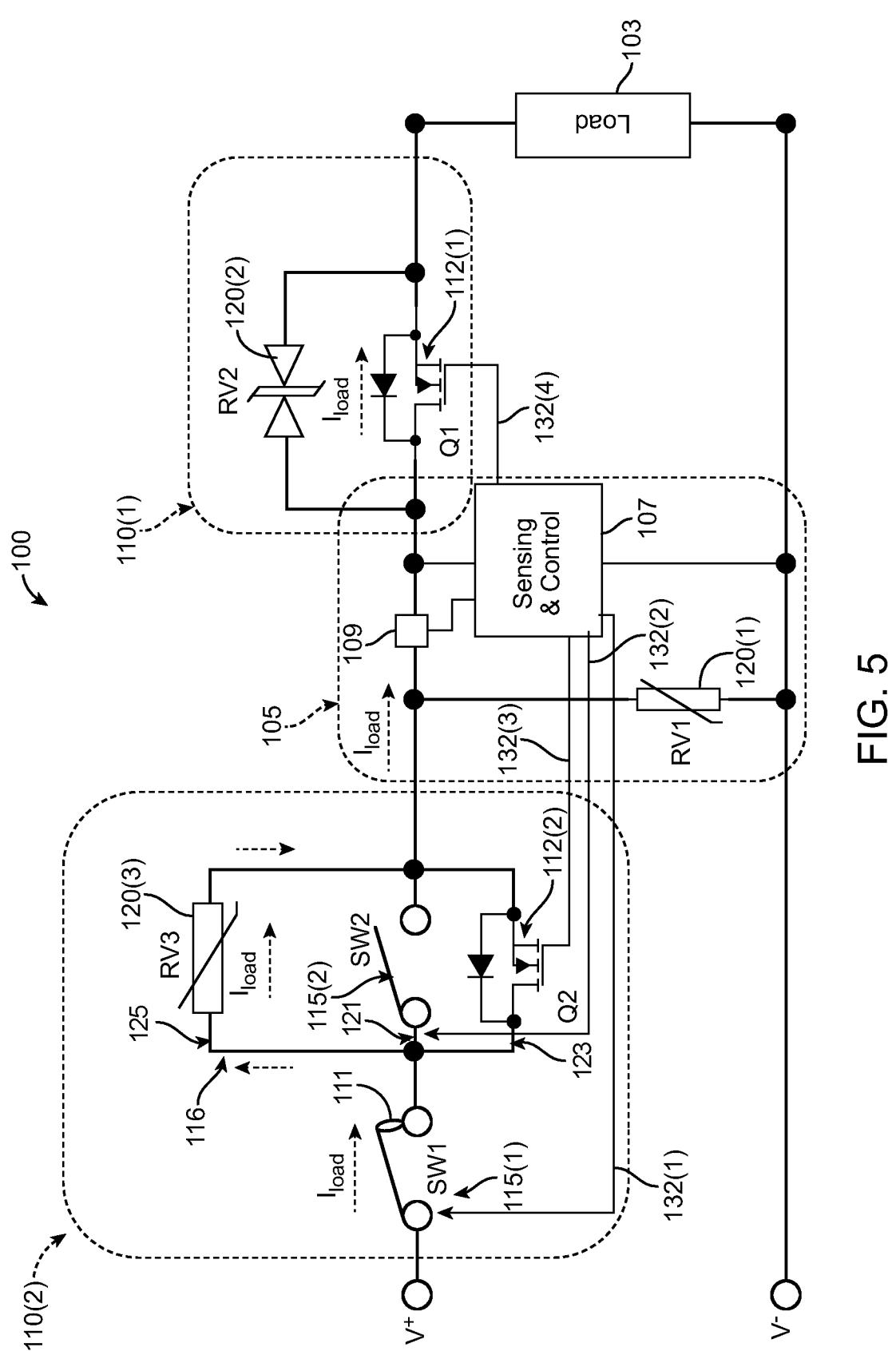
FIG. 5 illustrates the DC solid-state circuit breaker after switching off the solid-state switching component following the opening of the second switch to establish an energy absorption path.

Referring to FIG. 5, after both the isolation switch SW1 115(1) and the current commutation switch SW2 115(2) open wide enough to handle high voltages, the controller 107 outputs the third control signal 132(3) to invoke a third switching sequence, which turns off the second solid-state switching component Q2 112(2) to an energy absorption path to deliver current to the overvoltage protection device RV3 120(3) in the energy absorbing branch 125. In one or more non-limiting embodiments, the controller 107 can output the third control signal 132(3) after a predetermined time period (t4) has elapsed after opening current commutation switch SW2 115(2) to the current commutation switch SW2 115(2) open wide enough to handle high voltages. Accordingly, the load current ($I_{LOAD}$) is now conducted through the energy absorbing branch 125, where the overvoltage protection device RV3 120(3) completes interruption of the current. According to a non-limiting embodiment, the voltage rating of the overvoltage protection device RV3 120(3) can be selected such that it is activated to absorb and dissipate the energy of the load current ($I_{LOAD}$) when the current rating and/or the device threshold. After the second solid-state switching component Q2 112(2) shuts off, the arc 111 is still applied to isolation switch SW1 115(1). As a result, the isolation switch SW1 115(1) shares some of the high voltage with the parallel branches 121, 123 and 125 which lowers the voltage applied to the current commutation switch SW2 115(2) and its paralleling components (e.g., the second solid-state switching component Q2 112(2) and the overvoltage protection device RV3 120(3)).

When the overvoltage protection device RV3 120(3) interrupts the load current ($I_{LOAD}$), the arc 111 across the isolation switch SW1 115(1) is extinguished as well, because it is in series with the parallel branches 121, 123 and 125, which include the overvoltage protection device RV3

120(3), the current commutation switch SW2 115(2), and the second solid-state switching component Q2 112(2). After extinguishing the arc 111, the isolation switch SW1 115(1) inherently provides high-voltage isolation to withstand the system voltage. In this manner, the components included in the parallel branches 121, 123 and 125 (e.g., the overvoltage protection device RV3 120(3), the current commutation switch SW2 115(2), and the second solid-state switching component Q2 112(2)) are not required to have high voltage ratings and can be implemented using less expensive materials and reduced physical dimensions compared to the currently known DC solid-state circuit breakers.

Turning now to FIG. 6, a flow diagram illustrates a method of interrupting current delivered to a load 103 connected to a DC solid-state circuit breaker 100 according to a non-limiting embodiment of the present disclosure. The method begins at operation 600, and current is delivered to a load 103 at an initial time period (t$_1$) via a main circuit path established by a closed isolation switch 115(1) (e.g., a first switch) and a closed current commutation switch 115(2) (e.g., a second switch) at operation 602. At operation 604 a fault event (e.g., overcurrent event, overload event, short-circuit, etc.) is detected and/or an opening command is detected. As described herein, the fault event includes, for example, a failure of the first solid-state switching component 112(1), and the opening command can include, for example, a manual adjustment (e.g., opening) of the current commutation switch 115(2) and/or a remote controlled operation to adjust (e.g., open) the current commutation switch 115(2). At operation 606 the isolation switch 115(1) is opened at a second time period (t2) to interrupt a first airgap before opening the current commutation switch 115(2).

Turning to operation 608, a solid-state switching component 112(2) is turned on and the current commutation switch 115(2) is opened at a time period (t3) after opening the isolation switch 115(1) to establish a switch bypass current path. Time period (t3) is effectively a time period that delays turning on the solid-state switching component 112(2) and opening the isolation switch 115(1). According to one or more non-limiting embodiments, the time period can range, for example, from 3 ms to 5 ms. At operation 610, any current caused by an arc 111 across produced by opening the isolation switch 115(1) is conducted through the switch bypass current path. At operation 612, the solid-state switching component 112(2) is turned off at a fourth time period (t4) while the arc 111 remains applied to the isolation switch 115(1). Accordingly, voltage existing in the DC solid-state circuit breaker 100 is shared between the isolation switch 115(1) and the parallel branches 121, 123 and 125 of a fail-safe interruption circuit 116, and any remaining current is conducted through the energy absorption branch 125 of the fail-safe interruption circuit 116 where it is completely interrupted using an overvoltage protection device 120(3), and the method ends at operation 616. Although not illustrated, it should be appreciated that the method can include an operation to re-establish the main current path, which includes closing the current commutation switch 115(2) (e.g., the second switch), and then closing the isolation switch 115(1) (e.g., the first switch) at a time period after closing the current commutation switch 115(2) (e.g., the second switch) to avoid situations where the parallel branches 121, 123 and 125 realize the system voltage.

The techniques described herein can be particularly useful for a smaller, more cost effective, and more reliable DC circuit breaker design that uses a solid-state aided airgap to ensure successful interruption of current at DC conditions.

While particular embodiments are described in terms of this arrangement, the techniques described herein are not limited to such an arrangement but can also be used with other arrangements.

While embodiments of the present disclosure have been disclosed in exemplary forms, it will be apparent to those skilled in the art that many modifications, additions, and deletions can be made therein without departing from the spirit and scope of the disclosure and its equivalents, as set forth in the following claims.

Embodiments and the various features and advantageous details thereof are explained more fully with reference to the non-limiting embodiments that are illustrated in the accompanying drawings and detailed in the following description. Descriptions of well-known starting materials, processing techniques, components and equipment are omitted so as not to unnecessarily obscure embodiments in detail. It should be understood, however, that the detailed description and the specific examples, while indicating preferred embodiments, are given by way of illustration only and not by way of limitation. Various substitutions, modifications, additions and/or rearrangements within the spirit and/or scope of the underlying inventive concept will become apparent to those skilled in the art from this disclosure.

As used herein, the terms "comprises," "comprising," "includes," "including," "has," "having" or any other variation thereof, are intended to cover a non-exclusive inclusion. For example, a process, article, or apparatus that comprises a list of elements is not necessarily limited to only those elements but may include other elements not expressly listed or inherent to such process, article, or apparatus.

Additionally, any examples or illustrations given herein are not to be regarded in any way as restrictions on, limits to, or express definitions of, any term or terms with which they are utilized. Instead, these examples or illustrations are to be regarded as being described with respect to one particular embodiment and as illustrative only. Those of ordinary skill in the art will appreciate that any term or terms with which these examples or illustrations are utilized will encompass other embodiments which may or may not be given therewith or elsewhere in the specification and all such embodiments are intended to be included within the scope of that term or terms.

In the foregoing specification, the disclosure has been described with reference to specific embodiments. However, one of ordinary skill in the art appreciates that various modifications and changes can be made without departing from the scope of the disclosure. Accordingly, the specification and figures are to be regarded in an illustrative rather than a restrictive sense, and all such modifications are intended to be included within the scope of disclosure.

Although the invention has been described with respect to specific embodiments thereof, these embodiments are merely illustrative, and not restrictive of the invention. The description herein of illustrated embodiments of the invention is not intended to be exhaustive or to limit the invention to the precise forms disclosed herein (and in particular, the inclusion of any particular embodiment, feature or function is not intended to limit the scope of the invention to such embodiment, feature, or function). Rather, the description is intended to describe illustrative embodiments, features, and functions in order to provide a person of ordinary skill in the art context to understand the invention without limiting the invention to any particularly described embodiment, feature, or function. While specific embodiments of, and examples for, the invention are described herein for illustrative purposes only, various equivalent modifications are possible within the spirit and scope of the invention, as those skilled in the relevant art will recognize and appreciate. As indicated, these modifications may be made to the invention in light of the foregoing description of illustrated embodiments of the invention and are to be included within the spirit and scope of the invention. Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

Respective appearances of the phrases "in one embodiment," "in an embodiment," or "in a specific embodiment" or similar terminology in various places throughout this specification are not necessarily referring to the same embodiment. Furthermore, the particular features, structures, or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the invention.

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

It will also be appreciated that one or more of the elements depicted in the drawings/figures can also be implemented in a more separated or integrated manner, or even removed or rendered as inoperable in certain cases, as is useful in accordance with a particular application.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component.

What is claimed is:

1. A direct current (DC) solid-state circuit breaker comprising:
   a power electronics section that includes a first solid-state switching component;
   an airgap section connected in series with the power electronics section to establish a main current path configured to deliver a load current to a load, the airgap section implementing an isolation switch connected in series with a fail-safe interruption circuit that includes a current commutation switch, a second solid-state switching component, and an overvoltage protection device connected in parallel with one another;
   a sensing and control circuit in signal communication with the power electronic section and the airgap section, the control circuit configured to detect one or both of a fault event and an opening command, and in response to detecting one or both of the fault event and the opening command performs a fail-safe operation that controls the isolation switch at a time period, and controls the current commutation switch and the second solid-state switching component at a delayed time period that occurs after controlling the isolation switch, wherein the fail-safe operation includes a plurality of switching sequences that delay complete interruption of the load current using the fail-safe interruption circuit until after initially delaying the load current using the isolation switch.

2. The DC solid-state circuit breaker of claim 1, wherein the plurality of switching sequences includes a first switching sequence comprising:
   opening the isolation switch at the time period, while the second solid-state switching component is one of on or off, and while keeping the current commutation switch closed.

3. The DC solid-state circuit breaker of claim 2, wherein the plurality of switching sequences includes a second switching sequence comprising:
   maintaining the opening of the isolation switch;
   switching on the second solid-state switching component at the delayed time period; and
   opening the current commutation switch at the delayed time period.

4. The DC solid-state circuit breaker of claim 3, wherein the plurality of switching sequences includes a third switching sequence comprising switching off the second solid-state switching component at a switch-off time period that occurs after the delayed time period while maintaining the opening of the current commutation switch.

5. The DC solid-state circuit breaker of claim 4, wherein the second switching sequence establishes a bypass current path configured to deliver the load current to the second solid-state switching component while bypassing the current commutation switch.

6. The DC solid-state circuit breaker of claim 5, wherein the third switching sequence establishes an energy absorption path configured to deliver the load current to the overvoltage protection device while bypassing the current commutation switch.

7. The DC solid-state circuit breaker of claim 1, wherein the sensing and control circuit comprises:
   a sensor configured to measure the load current and to output a measured signal indicative of the measured load current;
   a controller in signal communication with the sensor to receive the measured signal, the controller configured to detect one or both of the fault event and the opening command based on the measured signal and to output one or more control signals to control the isolation switch, the current commutation switch and the second solid-state switching component in response to detecting the fault event.

8. The DC solid-state circuit breaker of claim 1, wherein the second solid-state switching component includes a metal-oxide-semiconductor field-effect transistor (MOSFET) or a thyristor.

9. The DC solid-state circuit breaker of claim 1, wherein the overvoltage protection device includes at least one of a Metal Oxide Varistor (MOV), a transient-voltage-suppression (TVS) diode, and a snubber circuit.

10. A method of interrupting current delivered to a load connected to a DC solid-state circuit breaker, the method comprising:

delivering current to a load connected to DC solid-state circuit breaker which includes a power electronics section and an airgap section connected in series with an airgap section, the airgap section including a fail-safe interruption circuit that comprises a current commutation switch, a second solid-state switching component, and an overvoltage protection device connected in parallel with one another;

detecting one or both of an electrical fault in the DC solid-state circuit breaker and an opening command;

performing a fail-safe operation that controls an isolation switch at a time period, and controls the current commutation switch and the second solid-state switching component at a delayed time period that occurs after controlling the isolation switch, wherein performing the fail-safe operation includes performing a plurality of switching sequences that delay complete interruption of the load current using the fail-safe interruption circuit until after initially delaying the load current using the isolation switch.

11. The method of claim 10, wherein performing the plurality of switching sequences includes performing a first switching sequence to open the isolation switch at the time period, while the second solid-state switching component is one of turned on or turned off and while keeping the current commutation switch closed.

12. The method of claim 11, wherein opening the isolation switch during the first switching sequence produces an electrical arc that applies an arc voltage on the isolation switch.

13. The method of claim 12, wherein the arc voltage remains on the isolation switch after switching off the second solid-state switching component such that voltage is shared between the isolation switch and the parallel connection of the current commutation switch, the second solid-state switching component, and the overvoltage protection device.

14. The method of claim 11, wherein performing the plurality of switching sequences includes performing a second switching sequence comprising:

maintaining the opening of the isolation switch;

switching on the second solid-state switching component at the delayed time period; and opening the current commutation switch at the delayed time period.

15. The method of claim 14, wherein performing the plurality of switching sequences includes performing a third switching sequence comprising switching off the second solid-state switching component at a switch-off time period that occurs after the delayed time period while maintaining the opening of the current commutation switch.

16. The method of claim 15, wherein performing the second switching sequence establishes a bypass current path configured to deliver the load current to the second solid-state switching component while bypassing the current commutation switch.

17. The method of claim 16, wherein performing the third switching sequence establishes an energy absorption path configured to deliver the load current to the overvoltage protection device while bypassing the current commutation switch.

18. The method of claim 10, further comprising:

measuring, by a sensor, the load current and outputting a measured signal indicative of the load current;

delivering the measured signal to a controller; and detecting, by the controller, one or both of the electrical fault and the opening command based on the measured signal, and outputting one or more control signals to control the isolation switch, the current commutation switch and the second solid-state switching component.

\* \* \* \* \*